US012696459B2

(12) United States Patent
Anderson et al.

(10) Patent No.: US 12,696,459 B2
(45) Date of Patent: Jul. 28, 2026

(54) BACKSIDE MRAM WITH FRONTSIDE DEVICES

(71) Applicant: INTERNATIONAL BUSINESS MACHINES CORPORATION, Armonk, NY (US)

(72) Inventors: Brent A. Anderson, Jericho, VT (US); Theodorus E. Standaert, Clifton Park, NY (US); Junli Wang, Slingerlands, NY (US); Lawrence A. Clevenger, Saratoga Springs, NY (US); Albert M. Chu, Nashua, NH (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 17/956,244

(22) Filed: Sep. 29, 2022

(65) Prior Publication Data

US 2024/0114699 A1     Apr. 4, 2024

(51) Int. Cl.
| | |
|---|---|
| *H10B 61/00* | (2023.01) |
| *H10B 63/00* | (2023.01) |
| *H10N 50/01* | (2023.01) |
| *H10N 70/00* | (2023.01) |

(52) U.S. Cl.
CPC ............. *H10B 61/22* (2023.02); *H10B 63/30* (2023.02); *H10N 50/01* (2023.02); *H10N 70/011* (2023.02)

(58) Field of Classification Search
CPC ........ H10B 63/30; H10B 61/22; H10N 50/01; H10N 70/011
See application file for complete search history.

(56) References Cited

U.S. PATENT DOCUMENTS

| | | | |
|---|---|---|---|
| 9,159,910 B2 | 10/2015 | Kang et al. | |
| 9,406,875 B2 | 8/2016 | Li et al. | |
| 9,917,137 B1 | 3/2018 | Briggs et al. | |
| 2014/0346624 A1* | 11/2014 | Shoji ..................... | H10N 50/01 257/421 |
| 2020/0006627 A1 | 1/2020 | Manipatruni et al. | |
| 2023/0253351 A1* | 8/2023 | Wang .................. | H01L 25/0657 257/773 |

OTHER PUBLICATIONS

Gaidis et al., "Two-level BEOL processing for rapid iteration in MRAM development", IBM J. Res. & Dev. Vol. 50 NO. 1, Jan. 2006, pp. 1-15.

Sugii et al., "STT-MRAM Development and Its Integration with BEOL Process for Embedded Applications", In ECS Meeting Abstracts, Jun. 4, 2012, pp. 1-2.

Swerts et al., "BEOL compatible high tunnel magneto resistance perpendicular magnetic tunnel junctions using a sacrificial Mg layer as CoFeB free layer cap", In Applied Physics Letters, Jun. 2015, pp. 1-6.

* cited by examiner

*Primary Examiner* — Shih Tsun A Chou
(74) *Attorney, Agent, or Firm* — Harrity & Harrity, LLP

(57) ABSTRACT

Semiconductor devices and methods of forming the same include a front-end-of-line (FEOL) layer that includes a first transistor device. A first back-end-of-line (BEOL) layer is on a front side of the FEOL layer and includes a first electrical connection to the first transistor device. A second BEOL layer is on a back side of the FEOL layer and includes a first BEOL device with a second electrical connection to the first transistor device.

20 Claims, 4 Drawing Sheets

Form devices in FEOL layer
702

Form frontside BEOL layer on FEOL layer
704

Remove substrate from FEOL layer
706

Form contact in FEOL layer to backside
surface
707

Form backside BEOL layer on FEOL layer
708

BACKSIDE MRAM WITH FRONTSIDE DEVICES

BACKGROUND

The present invention generally relates to semiconductor device fabrication and, more particularly, to devices that replace a substrate with additional device layers.

Semiconductor devices, such as integrated chips, may be formed on a substrate with a front-end-of-line layer including functional components and with a back-end-of-line layer including signal lines and power lines, which provide operational functions to the components in the front-end-of-line layer.

SUMMARY

A semiconductor device includes a front-end-of-line (FEOL) layer that includes a first transistor device. A first back-end-of-line (BEOL) layer is on a front side of the FEOL layer and includes a first electrical connection to the first transistor device. A second BEOL layer is on a back side of the FEOL layer and includes a first BEOL device with a second electrical connection to the first transistor device.

A semiconductor device includes a front-end-of-line (FEOL) layer that includes a first transistor device and a second transistor device. A first back-end-of-line (BEOL) layer is on a front side of the FEOL layer and includes a first electrical connection to the first transistor device and a second electrical connection to the second transistor device. A second BEOL layer is on a back side of the FEOL layer that includes a first BEOL device with a third electrical connection to the second transistor device.

A method of forming a semiconductor device includes forming front-end-of-line layer (FEOL), including a first transistor device, on a substrate. A first back-end-of-line (BEOL) layer is formed on a front side of the FEOL layer that includes a first electrical connection to the first transistor device. The substrate is removed from the FEOL layer. A second BEOL layer is formed on a back side of the FEOL layer that includes a first BEOL device with a second electrical connection to the first transistor device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
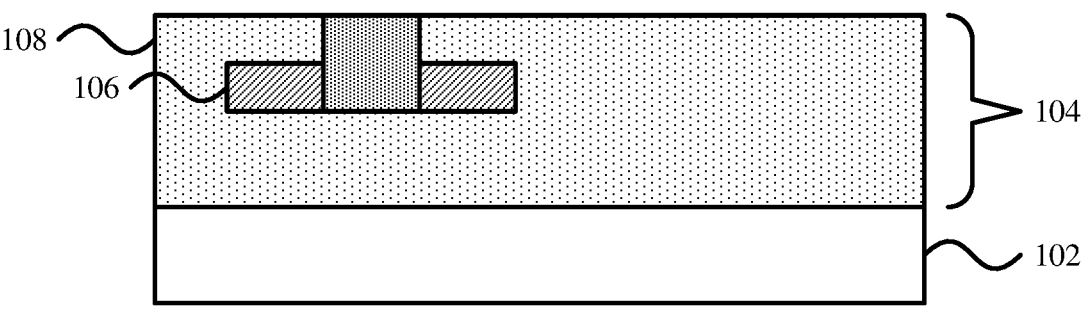
FIG. 1 is a cross-sectional diagram of a step in the formation of a semiconductor device that includes a front side back-end-of-line (BEOL) layer and a back side BEOL layer that has embedded electronics, showing a front-end-of-line (FEOL) layer being formed with a transistor device on a substrate, in accordance with an embodiment of the present invention.

As device feature size decreases and device density increases, routing for devices in a front-end-of-line (FEOL) layer of an integrated chip becomes more challenging. In applications such as neuromorphic computing devices, where analog computing hardware may be used to perform the operations of a neural network, programmable resistance devices may be included as well as transistors. These programmable resistance devices may benefit from being fabricated using different processes as compared to the transistors, and so may be formed outside of the FEOL layer. However, locating these devices within the back-end-of-line (BEOL) layer(s) presents its own challenges, as placing the programmable resistance devices close to the FEOL layer may obstruct signal and power routing, and placing the programmable resistance devices far from the FEOL layer may increase power losses due to resistance and parasitic capacitances.

The programmable resistance devices may instead be formed on a side of the FEOL layer that is opposite to the BEOL layer(s). This side is referred to herein as a "backside" of the device. After the FEOL layer is formed, and after the BEOL layer(s) are formed on the frontside of the device, a substrate may be removed from the backside of the FEOL layer and additional devices may be formed. The backside of the FEOL layer may therefore be populated with devices, including programmable resistance devices and others, and may additionally have independent backside BEOL layer(s) to serve the backside devices, such as a backside power distribution network to deliver power to different parts of the chip.

In such a structure, there may be devices and signal lines on one or both of the frontside and backside BEOL layers, along with power distribution networks on one or both sides of the FEOL layer. Thus, adding devices on the backside of the FEOL layer provides substantially more room for wiring, reduces resistance and capacitances, provides flexibility for device placement, and protects sensitive components from damage during certain fabrication processes.

For example, devices that are embedded in frontside and/or backside BEOL layers may be used to form embedded magnetoresistive random access memory (MRAM) devices, for example for use in systems-on-chips (SoCs). They may be used to integrate storage features with complementary metal-oxide-semiconductor (CMOS) devices in a chip. MRAM devices may be made from materials that are sensitive to high temperatures, which make it challenging to use MRAM devices in the FEOL layer if fabrication of the FEOL layer uses high-temperature processes.

Such devices may also be used in static random access memory (SRAM) applications. In some embodiments, SRAM may be unified with flash memory in a single MRAM block for use in small, portable devices that run on batteries, such as Internet of Things (IoT) devices. Such applications may prioritize low-power operation, and placing memory devices close to logic can reduce power losses due to signal and power transmission over large portions of a chip. Such devices may also be used for last-level caches.

Referring now to FIG. 1, a cross-sectional view of a step in the formation of a semiconductor device is shown. A semiconductor substrate 102 is shown with a FEOL layer 104 positioned over it. The FEOL layer 104 may include a transistor device 106 within an interlayer dielectric 108.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

Although a transistor device 106 is shown and described herein, it should be understood that any appropriate type of circuit component may be used instead, or in addition. For example, the FEOL layer 104 may include any appropriate active or passive electronic components, such as transistors of any type, diodes, capacitors, and inductors. The transistor device 106 is contemplated as being a field effect transistor (FET) that includes a semiconductor channel between doped semiconductor source and drain structures. The source and drain structures may be formed from a doped semiconductor material. A gate stack contacts the channel of the transistor device 106, including a gate dielectric and a gate conductor.

The gate dielectric of the transistor device 106 may include any appropriate dielectric material, such as a high-k dielectric that has a dielectric constant k greater than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor of the transistor device 106 may include any appropriate conductive material. Examples of conductive materials include, but are not limited to, conductive metals such as, e.g., tungsten, nickel, titanium, molybdenum, tantalum, copper, platinum, silver, gold, ruthenium, iridium, rhenium, rhodium, cobalt, and alloys thereof. The gate conductor may alternatively be formed from a doped semiconductor material such as, e.g., doped polysilicon.

The interlayer dielectric 108 may be formed around the transistor device 106, and may be formed from any appropriate dielectric material, such as silicon dioxide or a low-k dielectric material, using any appropriate deposition process. The transistor device 106 may be fully embedded within the interlayer dielectric 108 or may have one or more components that reach a surface of the interlayer dielectric 108. For example, the gate of the transistor device 106 may be exposed at a top surface of the interlayer dielectric 108. The gate of the transistor device 106 may include a gate conductor, formed from any appropriate conductive material, that may also serve as an electrical contact to the transistor device 106.

While a planar FET is illustrated herein as the transistor device 106, it should be understood that any appropriate transistor structure may be used instead. For example, other types of FET devices that may be used include FETs, nanowire or nanosheet FETs, junction FETs, metal-oxide-semiconductor FETs, n-type FETs, p-type FETs, complementary FETs (CFETs), and vertical transport FETs (VT-FETs). Non-FET transistor devices may include bipolar transistors and insulated-gate bipolar transistors. It is also contemplated that devices other than transistors may be used, including any appropriate active or passive circuit component.

The fabrication of the FEOL layer 104 may include any appropriate process or processes, including depositions, epitaxial growth, etches, photolithographic patterning, and polishing. In intermediate steps in the formation of the FEOL layer 104, multiple different components in addition to the transistor device 106 may be formed. These devices may interconnect with the transistor device 106 and with each other, by electrical paths within the FEOL layer 104 or by paths in other layers, to form an integrated circuit. The interlayer dielectric 108 may be deposited over and around such devices to provide structural support and electrical insulation.

Figure 2:
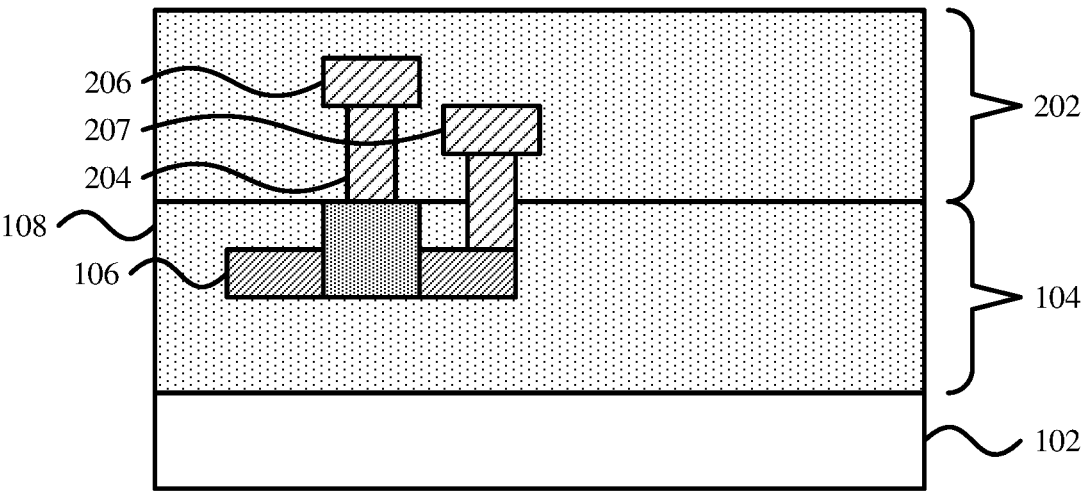
FIG. 2 is a cross-sectional diagram of a step in the formation of a semiconductor device that includes a front side back-end-of-line (BEOL) layer and a back side BEOL layer that has embedded electronics, showing a front side BEOL layer being formed on the FEOL layer, in accordance with an embodiment of the present invention.

Referring now to FIG. 2, a cross-sectional view of a step in the formation of a semiconductor device is shown. A BEOL layer 202 is formed on the frontside of the FEOL layer 104. The BEOL layer 202 may include one or more layers of metallization, with each metallization layer including one or more parallel conductive lines. The metallization layers may each have an orientation of conductive lines that is perpendicular to the conductive lines of the metallization layer directly above or below.

The BEOL layer 202 may include conductive lines, including conductive lines that perform the functions of wordline 206 and source line 207, formed from any appropriate conductive material. Electrical contacts 204 may be formed within the BEOL layer 202 to provide electrical connections between the conductive lines 206/207 and respective portions of the transistor device 106 in the FEOL layer 104. The conductive lines 206/207 may include a source line electrically connected to the source or drain region of the transistor device 106 and a word line electrically connected to the gate conductor of the transistor device 106.

As will be described in greater detail below, the BEOL layer 202 may further include additional devices, such as programmable resistance devices, memory devices, and any other appropriate circuit components. These BEOL devices may be connected to portions of the transistor device 106 and to other components within the FEOL layer 104 by electrical contacts 204. The BEOL devices may further be interconnected to one another by conductive paths within the BEOL layer 202.

The BEOL layer 202 may be formed by, e.g., deposition of a dielectric material, etching features such as trenches and vias into the dielectric material, and filling the trenches and vias with conductive material. Additional layers of metallization may be added to the BEOL layer 202 by depositing additional dielectric material on top of the previous layer of the BEOL layer 202 and then forming metallization structures within the additional material. Connections may be made to underlying layers of the BEOL layer 202 by forming vias, and connections between upper layers of the BEOL layer 202 and the FEOL layer 104 may be formed by forming a series of vertically aligned vias through successive metallization layers.

Figure 3:
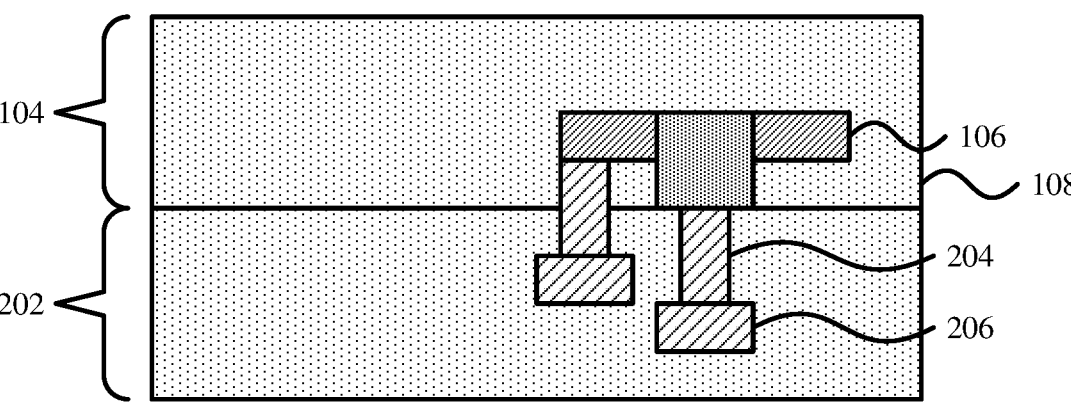
FIG. 3 is a cross-sectional diagram of a step in the formation of a semiconductor device that includes a front side back-end-of-line (BEOL) layer and a back side BEOL layer that has embedded electronics, showing removal of the substrate from the FEOL layer to expose a back side of the FEOL layer, in accordance with an embodiment of the present invention.

Referring now to FIG. 3, a cross-sectional view of a step in the formation of a semiconductor device is shown. The wafer may be flipped upside down, so that the semiconductor substrate 102 is positioned on the top. This may be accomplished by, for example, bonding the wafer to a handler and using the handler to manipulate the wafer.

The semiconductor substrate 102 may then be removed from the FEOL layer 104 to expose the backside of the FEOL layer 104. The substrate 102 may be removed using any appropriate mechanical or chemical process. For example, a chemical etch may be used to thin the semiconductor substrate layer 102 and a chemical mechanical planarization (CMP) process may be used to expose the underlying FEOL layer 104.

CMP is performed using, e.g., a chemical or granular slurry and mechanical force to gradually remove upper layers of the device. The slurry may be formulated to be unable to dissolve, for example, the material of the interlayer dielectric 108, resulting in the CMP process's inability to proceed any farther than that layer.

Figure 4:
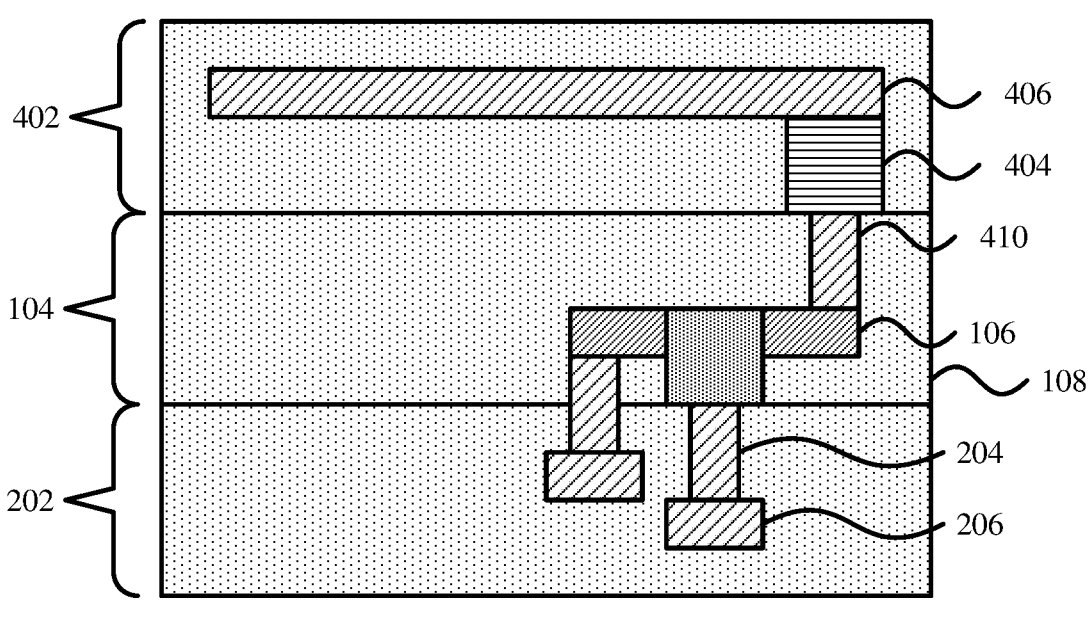
FIG. 4 is a cross-sectional diagram of a step in the formation of a semiconductor device that includes a front side back-end-of-line (BEOL) layer and a back side BEOL layer that has embedded electronics, showing formation of a back side BEOL layer on the exposed back side of the FEOL layer, including a memory device, in accordance with an embodiment of the present invention.

Referring now to FIG. 4, a cross-sectional view of a step in the formation of a semiconductor device is shown. One or more electrical contacts 410 may be formed in the FEOL 104, penetrating the interlayer dielectric 108 to contact the transistor device. The electrical contact 410 may be formed by etching a via into the interlayer dielectric 108 and filling the via with any appropriate conductive material using any appropriate deposition process. The electrical contact 410 may make contact with one or more parts of the transistor device 106 to provide electrical connectivity to the transistor device 106. For example, an electrical contact 410 may make contact with a source or drain region of the transistor device 106 and may extend to the surface of the interlayer dielectric 108.

For example, the via may be etched into the interlayer dielectric 108 using a photolithographic process. A pattern may be produced by applying a photoresist to the backside surface of the FEOL layer 104 and exposing the photoresist to a pattern of radiation to cure parts of the photoresist. A developer may then be used to remove uncured material from the photoresist, exposing a portion of the surface of the FEOL layer 104. This exposed portion may correspond to a location of the via. An anisotropic etch, such as reactive ion etching (RIE) may be used to directionally etch into the interlayer dielectric 108 to form the via. A deposition process such as chemical vapor deposition (CVD) or atomic layer deposition (ALD) may then be used to fill the via with a metal or other conductive material.

Reactive Ion Etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

A backside layer 402 is formed on the backside of the FEOL 104. The backside layer 402 may include devices that communicate with devices in the FEOL layer 104. For example, a programmable resistance device 404 is shown in contact with the electrical contact 410. There may be a conductive line 406, such as a bitline, in contact with the programmable resistance device 404, providing an electrical communication path to the programmable resistance device. The conductive line 406 may represent a bitline. The backside layer 402 may include metallization layers to from a backside BEOL layer.

It is contemplated that any appropriate device may be used in place of the programmable resistance device 404. The programmable resistance device 404 may include a magnetoresistive random access memory (MRAM) cell, for example implemented as a magnetic tunnel junction (MTJ). An MRAM cell is a structure that can store information by setting a magnetic state of the cell. In some examples, a first magnetic state may be associated with a first resistance of the MRAM cell and a second magnetic state may be associated with a second resistance of the MRAM cell. The value stored in the MRAM cell may be read out by applying a voltage, measuring the resulting current, and calculating the resistance using Ohm's law.

In an MTJ in particular, the magnetic state may be encoded by the orientation of a magnetic polarity of a free magnetic layer relative to the magnetic polarity of a pinned magnetic layer. Whereas the free magnetic layer may change its magnetic polarity, the pinned magnetic layer has a stable polarity that points in a consistent direction. A first magnetic state may then be represented by the polarity of the free magnetic layer being parallel to the polarity of the pinned magnetic layer, while a second magnetic state may be represented by the polarity of the free magnetic layer being antiparallel to the polarity of the pinned magnetic layer. Each of these magnetic states may correspond to a different respective resistance of the MTJ cell. Information may then be encoded in the magnetic state of the MTJ cell by setting the resistance to a particular value, and information may be read out of the MTJ cell measuring the resistance using Ohm's law.

A tunnel barrier may be positioned between the free magnetic layer and the pinned magnetic layer of an MTJ, with the tunnel barrier being formed from a thin electrical insulator. Electrons can tunnel across the barrier by quantum tunneling effects, and the barrier can be used to filter the electrons according to their quantum state. The magnetic state of the device affects the potential barrier experienced by the electrons, with one state imposing a higher potential barrier than the other. As a result, one state will permit a greater number of electrons across the tunnel barrier than the other state, resulting in differences in the effective resistance of the MTJ cell.

A variety of methods may be used to write information to an MTJ cell, causing the magnetic polarity of the free magnetic layer to change from one of the magnetic states to the other. In some embodiments, the pinned magnetic layer may perform spin polarization on currents across the MTJ cell. Angular momentum from the spin-polarized current is transferred to the free magnetic layer and effects a change in the magnetization of the free magnetic layer, changing the polarity and thus the magnetic state of the MTJ cell.

While MRAM cells, and particularly MTJ cells, are specifically contemplated, it should be understood that other types of memory cell may be used instead to implement the programmable resistance device 106. For example, the programmable resistance device 106 may be a phase change memory (PCM) cell or a resistive random access memory cell.

The materials of the programmable resistance device 404 may be relatively fragile or sensitive to heat as compared to the materials used in fabricating devices in the FEOL layer 104. In particular, the materials of the programmable resistance device 404 may have a lower melting point than temperatures used in the fabrication of the FEOL layer 104, such that they would risk damage or destruction if they were fabricated during the same processes that create the FEOL layer 104. Positioning such devices in the backside layer 402 can thereby protect the programmable resistance device 404 from damage.

Backside BEOL layers may be formed as part of the backside layer 402, for example in the same manner as the formation of the frontside BEOL layer 202. Metallization layers may be formed on the backside of the FEOL layer 104 by depositing dielectric material, etching trenches into the dielectric material, and depositing conductive material in the trenches using any appropriate deposition process. Thus the backside layer 402 may include additional conductive lines and may further include a backside power distribution network to provide electrical power to devices in the backside layer 402 and in the FEOL layer 104.

Figure 5:
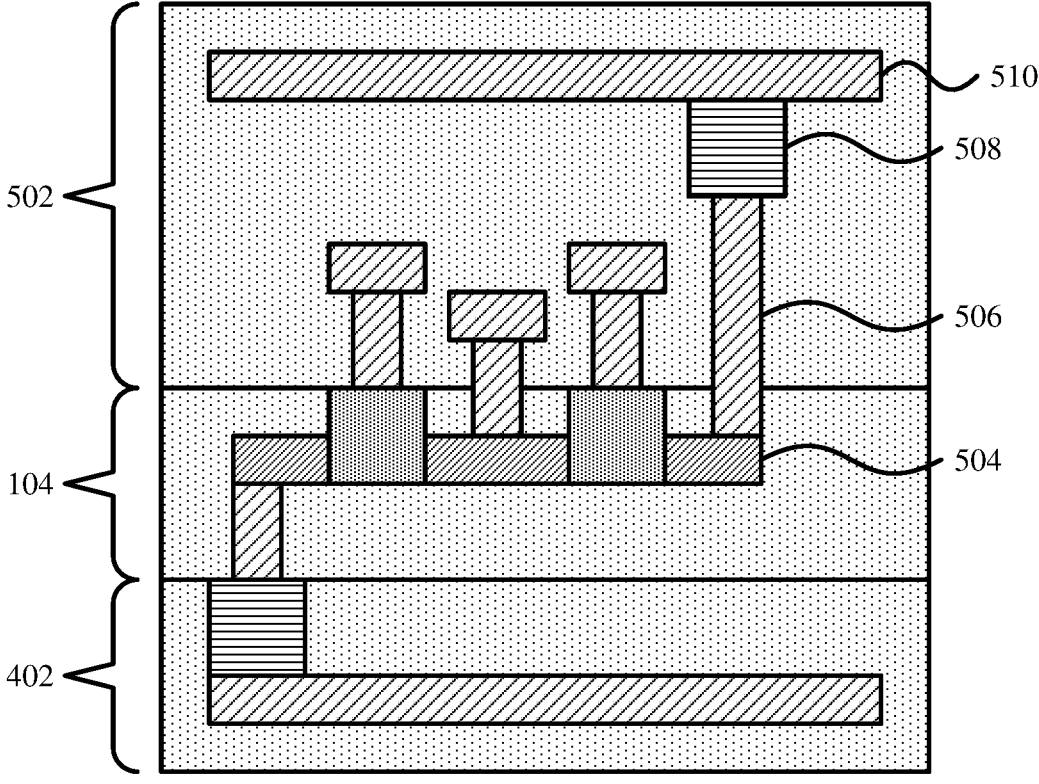
FIG. 5 is a cross-sectional diagram of a semiconductor device that includes a front side back-end-of-line (BEOL) layer and a back side BEOL layer that has embedded electronics, showing an embodiment that includes a FEOL that has a transistor device with additional electrical terminals, in accordance with an embodiment of the present invention.

Referring now to FIG. 5, a cross-sectional view of an alternate embodiment is shown. A BEOL layer 502 is shown that includes additional devices, including a programmable resistance device 508. The FEOL layer 104 includes a transistor device 504 with additional terminals, such as a pair of planar FETs that share a source or drain structure. The transistor device 504 may be connected to the BEOL programmable resistance device 508 by a conductive via 506 that pierces through the dielectric material of the BEOL layer 502, for example passing through one or more metallization layers. A conductive line 510 connects to the programmable resistance device 508 and may act as a frontside bitline.

In such embodiments, programmable resistance devices (and other devices) may be formed in both the frontside BEOL layer 502 and in the backside BEOL layer 202, to further increase the options that a circuit designer has for routing connections and for optimizing performance. Other options include forming transistor devices in different respective layers, for example forming a CFET by putting an n-type FET on a first layer, above a p-type FET on a second layer. The programmable resistance devices in the different respective BEOL layers may connect to different transistor devices in such a stacked arrangement.

While it is specifically contemplated that the programmable resistance devices of the frontside BEOL layer 502 and the backside layer 402 may both be MTJ MRAM cells, it should be understood that each programmable resistance device may be implemented as any appropriate device, including as PCM cells or resistive random access memory cells, and may be implemented as the same type of device or as different respective types of device.

Figure 6:
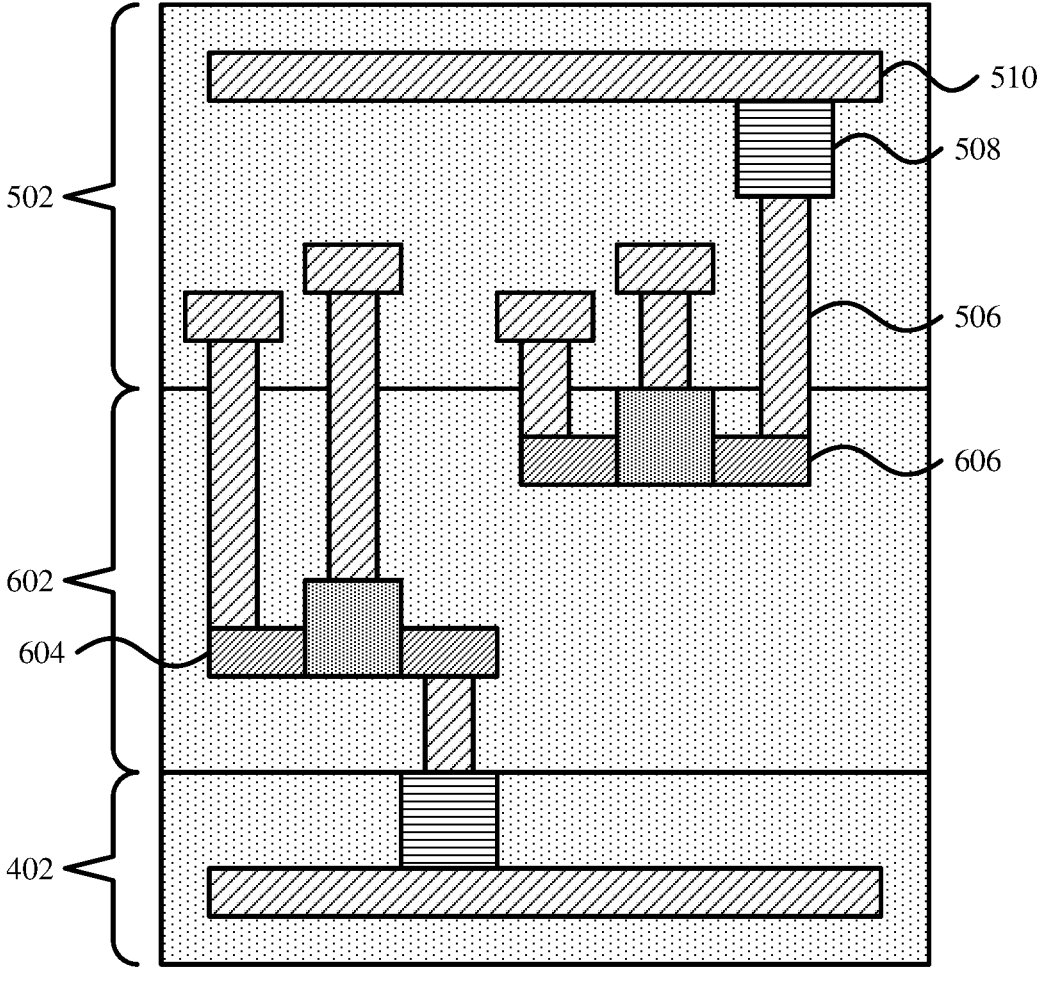
FIG. 6 is a cross-sectional diagram of a semiconductor device that includes a front side back-end-of-line (BEOL) layer and a back side BEOL layer that has embedded electronics, showing a FEOL layer that includes multiple transistor devices at different depths and memory devices in multiple BEOL layers, in accordance with an embodiment of the present invention.

Referring now to FIG. 6, a cross-sectional view of an alternate embodiment is shown. The FEOL layer 602 may have multiple layers of transistor devices, including upper devices 606 and lower devices 604. Each layer of the transistor devices may connect to BEOL devices embedded in the closest respective BEOL layer. Thus, the upper devices 606 may connect to devices in the frontside BEOL 502, while the lower devices 604 may connect to devices in the backside BEOL 402.

The upper devices 606 and the lower devices 604 may differ in their properties. For example, upper devices 606 may have a first semiconductor device polarity type, whereas lower devices 604 may have a second semiconductor device polarity type. Such polarity types may include an n-type device and a p-type device, where dopants in the devices cause the devices to have different electrical and semiconductor properties. The upper devices 606 and the lower devices 604 may furthermore be connected to one another through the FEOL layer 602, for example with a contact that connects a terminal of an upper device 606 to a terminal of a lower device 604. Such an arrangement may be used to form, e.g., complementary devices that include a respective transistor device of each polarity.

Figure 7:
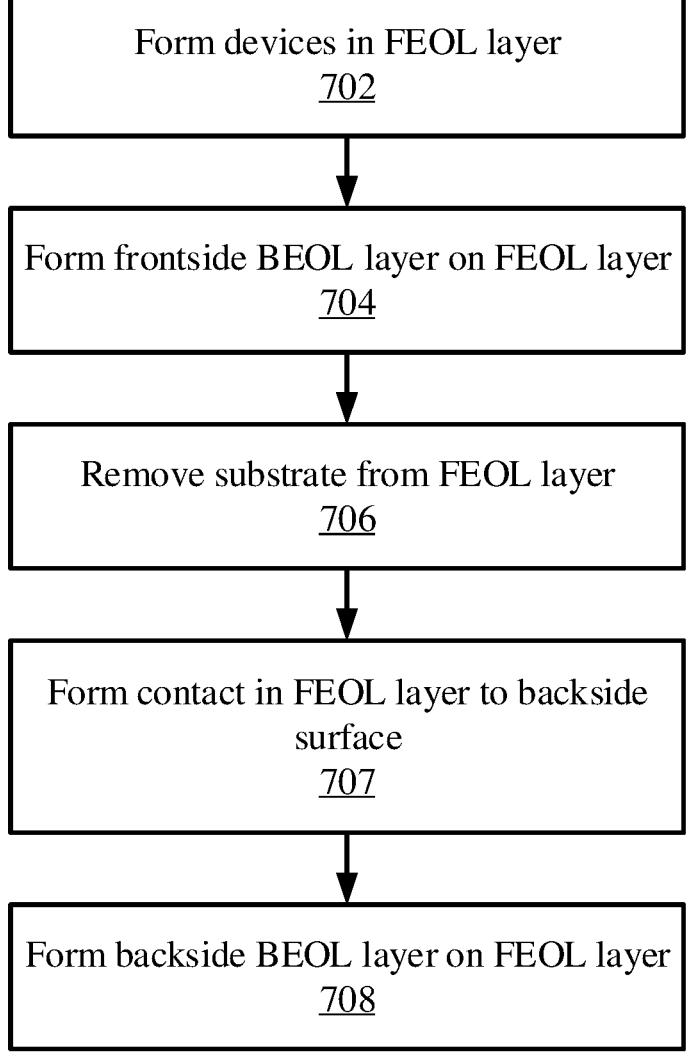
FIG. 7 is a block/flow diagram of a method of forming a semiconductor device that includes a front side back-end-of-line (BEOL) layer and a back side BEOL layer that has embedded electronics, in accordance with an embodiment of the present invention.

Referring now to FIG. 7, a method for forming a semiconductor device is shown. Block 702 forms devices within an FEOL layer. In some embodiments, the FEOL layer may be a single-layer FEOL layer 104, while in other embodiments the FEOL layer may be a multi-layer FEOL layer 602. The FEOL layer may include transistor devices and other circuit components, and these components may be interconnected by conductive paths within the FEOL layer or by paths in other layers to form an integrated circuit. In some embodiments the devices in the FEOL layer may have one or more portions that are exposed on a surface of the FEOL layer.

Formation of the devices within the FEOL layer may include any appropriate set of deposition steps, growth steps, etching steps, patterning steps, polishing steps, and any other appropriate processes. Transistor devices within the FEOL layer may include, e.g., planar FETs or any other kind of transistor structure. The transistor devices may include, for example, a single-device transistor structure 106 or a dual-device transistor structure 504 with two transistors that share a source or drain.

Block 704 forms a frontside BEOL layer on the FOEL layer. The frontside BEOL layer may be a layer 202 that includes only metallization layers or may be a layer 502 that includes metallization layers as well as devices, such as the frontside programmable resistance device 508. The frontside BEOL layer may include wordlines, source lines, and/or bitlines for the device(s) in the FEOL layer, as appropriate. The frontside BEOL layer may be formed using any appropriate combination of processing steps, such as by depositing a dielectric material, patterning and etching trenches into the dielectric material, and depositing conductive material in the trenches. Devices that may be formed in the frontside BEOL layer may include an MRAM cell, for example implemented as an MTJ cell. The frontside BEOL layer may be formed using processes that operate at temperatures and pressures which will not damage the devices within the frontside BEOL layer.

Block 706 removes the substrate 102 from the FEOL layer by any appropriate mechanical or chemical process, for example using a combination of a chemical etch and a CMP process to selectively thin and then remove the semiconductor substrate layer 102. The removal of the substrate 102 exposes a backside surface of the FEOL layer. Block 707 may etch the exposed backside surface of the FEOL layer may be etched to form a via, and may then fill that via with conductive material to form an electrical contact that extends from the backside surface of the FEOL layer to make electrical contact with the transistor device.

Block 708 then forms backside BEOL layer 402 on the backside surface of the FEOL layer, for example including any appropriate devices and metallization layers. The backside BEOL layer 702 may include, for example a programmable resistance device 404 and any conductive lines and vias that are needed for signal and power functions. The backside BEOL layer 402 may include wordlines, source lines, and/or bitlines for the device(s) in the FEOL layer, as appropriate.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other vise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below." "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of backside MRAM with frontside devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A semiconductor device, comprising:
a front-end-of-line (FEOL) layer that includes a first transistor device and a second transistor device that is formed at a different depth within the FEOL layer as compared to a first transistor depth of the first transistor device;
a first back-end-of-line (BEOL) layer on a front side of the FEOL layer that includes a first electrical connection to the first transistor device and further includes a BEOL device electrically connected to the second transistor device; and
a second BEOL layer on a back side of the FEOL layer that includes a first BEOL device with a second electrical connection to the first transistor device.

2. The semiconductor device of claim 1, wherein the first BEOL device includes a first programmable resistance device.

3. The semiconductor device of claim 2, wherein the first BEOL layer further includes a second programmable resistance device, connected to the first transistor device by the first electrical connection.

4. The semiconductor device of claim 3, wherein the first programmable resistance device and the second programmable resistance device are selected from the group consisting of a magnetic tunnel junction cell, a phase change memory cell, and a resistive random access memory cell.

5. The semiconductor device of claim 1, wherein the first transistor device has a first polarity and the second transistor device has a second polarity.

6. The semiconductor device of claim 1, wherein the second BEOL layer includes a backside power distribution network.

7. The semiconductor device of claim 1, wherein the first BEOL layer includes a wordline and a source line in electrical communication with the first transistor device and the second BEOL layer includes a bitline in electrical communication with the first BEOL device.

8. A semiconductor device, comprising:
a front-end-of-line (FEOL) layer that includes a first transistor device and a second transistor device, wherein the first transistor device has a first polarity and the second transistor device has a second polarity;
a first back-end-of-line (BEOL) layer on a front side of the FEOL layer that includes a first electrical connection to the first transistor device and a second electrical connection to the second transistor device; and
a second BEOL layer on a back side of the FEOL layer that includes a first BEOL device with a third electrical connection to the second transistor device.

9. The semiconductor device of claim 8, wherein the first BEOL device includes a first programmable resistance device.

10. The semiconductor device of claim 9, wherein the first BEOL layer further includes a second programmable resistance device, connected to the first transistor device by the first electrical connection.

11. The semiconductor device of claim 10, wherein the first programmable resistance device and the second programmable resistance device are selected from the group consisting of a magnetic tunnel junction cell, a phase change memory cell, and a resistive random access memory cell.

12. The semiconductor device of claim 8, wherein the second transistor device is formed at a different depth within the FEOL layer as compared to a first transistor depth of the first transistor device.

13. The semiconductor device of claim 8, wherein the second BEOL layer includes a backside power distribution network.

14. The semiconductor device of claim 8, wherein the first BEOL layer includes a wordline, a source line, and a bitline in electrical communication with the first transistor device and a wordline and a source line in electrical communication with the second transistor device and wherein the second BEOL layer includes a bitline in electrical communication with the second transistor device.

15. A semiconductor device, comprising:
a front-end-of-line (FEOL) layer that includes a first transistor device with a first polarity and a second transistor device with a second polarity, the second transistor device being formed at a different depth within the FEOL layer as compared to a first transistor depth of the first transistor device;
a first back-end-of-line (BEOL) layer on a front side of the FEOL layer that includes a first electrical connection to the first transistor device; and
a second BEOL layer on a back side of the FEOL layer that includes a first BEOL device with a second electrical connection to the first transistor device.

16. The semiconductor device of claim 15, wherein the first BEOL device includes a first programmable resistance device.

17. The semiconductor device of claim 16, wherein the first BEOL layer further includes a second programmable resistance device, connected to the first transistor device by the first electrical connection.

18. The semiconductor device of claim 17, wherein the first programmable resistance device and the second programmable resistance device are selected from the group consisting of a magnetic tunnel junction cell, a phase change memory cell, and a resistive random access memory cell.

19. The semiconductor device of claim 15, wherein the second BEOL layer includes a backside power distribution network.

20. The semiconductor device of claim 15, wherein the first BEOL layer includes a wordline and a source line in electrical communication with the first transistor device and the second BEOL layer includes a bitline in electrical communication with the first BEOL device.

* * * * *